(12) United States Patent
Bukofsky et al.

(10) Patent No.: US 7,135,255 B2
(45) Date of Patent: Nov. 14, 2006

(54) LAYOUT IMPACT REDUCTION WITH ANGLED PHASE SHAPES

(75) Inventors: Scott J. Bukofsky, Hopewell Junction, NY (US); John K. DeBrosse, Colchester, VT (US); Marco Hug, South Burlington, VT (US); Lars W. Liebmann, Poughquag, NY (US); Daniel J. Nickel, Westford, VT (US); Juergen Preuninger, Munich (DE)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 271 days.

(21) Appl. No.: 10/249,317

(22) Filed: Mar. 31, 2003

(65) Prior Publication Data
US 2004/0191638 A1    Sep. 30, 2004

(51) Int. Cl.
*G01F 9/00*    (2006.01)
(52) U.S. Cl. .......................... 430/5
(58) Field of Classification Search ............. 430/5, 430/323, 324
See application file for complete search history.

(56) References Cited
U.S. PATENT DOCUMENTS

| | | | |
|---|---|---|---|
| 5,484,672 A | 1/1996 | Bajuk et al. | |
| 5,537,648 A | 7/1996 | Liebmann et al. | |
| 5,538,833 A | 7/1996 | Ferguson et al. | |
| 5,766,804 A | 6/1998 | Spence | |
| 5,807,649 A | 9/1998 | Liebmann et al. | |
| 6,187,480 B1 | 2/2001 | Huang | |
| 6,335,128 B1 | 1/2002 | Cobb et al. | |
| 6,376,130 B1 | 4/2002 | Stanton | |
| 6,451,488 B1 | 9/2002 | Rhodes | |

*Primary Examiner*—S. Rosasco
(74) *Attorney, Agent, or Firm*—DeLio & Peterson, LLC; Robert Curcio; Todd M. C. Li (57) ABSTRACT

A phase shift mask shape that reduces line-end shortening at the critical feature without changing layout size increases required of requisite phase shift rules. The phase feature is given an angled extension, which includes the lithographic shortening value. This allows the critical shape to be designed much closer to the reference layer then it could without the angled extension feature. Phase mask extension features beyond a given device segment are significantly reduced by lengthening the feature along an uncritical portion; moving the feature reference point to the device layer; and flattening the phase extension feature into an L-shape or T-shape along the uncritical parts of a device segment. Applying these design rules allows a draw of the gate conductor under current conditions and puts phase shapes inside without extending the gate conductor dimensions to the next feature.

19 Claims, 8 Drawing Sheets

LAYOUT IMPACT REDUCTION WITH ANGLED PHASE SHAPES

BACKGROUND OF INVENTION

The present invention relates generally to lithography in very large scale integrated (VLSI) chip manufacturing, and more particularly to an improved phase shifted mask (PSM) lithography.

In recent years, demands to increase the number of transistors on a wafer have required decreasing the size of the features, but this has introduced diffraction effects, which have posed limitations on the desired feature size. Lithography in the context of VLSI manufacturing is the process of patterning openings in photosensitive polymers, commonly referred to as photoresists, which define small areas in which the silicon base material is modified by a specific operation in a sequence of processing steps. Conventionally, photoresist chemistry is optimized to discriminate between the brighter and darker intensities.

Phase-shift lithography was developed to enhance the range of conventional optical photolithography. Phase-shift lithography is based on opposite phase destructive interference of the waves of incident light. By shifting the phase of one region of incident light wave approximately 180° relative to an adjacent region of incident light waves, a sharply defined dark zone is created beneath the phase-shift mask due to destructive interferences of the waves. This zone defines the interface between light and dark regions, and hence defines the boundary between exposed and unexposed portions of the resist layer underlying the phase-shift mask. Having a portion of incident light traverse through a longer distance, or conversely, traverse through a shorter distance, typically generates interference phase shifting. The distance differences that the incident light traverses establishes a comparative phase shift. The longer distance may be established by introducing an extra deposited layer through which the light must travel. The shorter distance may be achieved by virtue of an etched groove. Phase-shifting masks are now well known in the art, and there are many varieties that have been employed.

The resolution, R, of a lithography tool is defined by the equation:

$$R = \kappa_1 \lambda / NA$$

where, $\lambda$ is a wavelength of the electromagnetic radiation used in the exposure;

NA is a numerical aperture of the optical system; and $\kappa_1$ is an Aries factor, which relates to the limit of diffraction.

Phase shifted mask lithography improves the lithographic process latitude, allowing the operation of a lower Aries factor or $\kappa_1$ value. Specifically, the electric field vector of the incident light, having magnitude and direction, can be made to constructively interfere with a 0° phase change or with an 180° phase change. For example, light traveling through a thicker portion of material of a predetermined thickness and index of refraction can be made 180° out of phase with incident light not traversing through the thicker material. The electric field vectors of this out-of-phase light will be of equal magnitude but in opposite directions, so that any interaction between these vectors will result in cancellation (destructive interference).

Conversely, light that is in phase will constructively interfere. The thickness of the masking layer is chosen to achieve the desired opacity. Thus, a binary nature of the image is projected, represent by areas of high intensity and areas of low or zero intensity. However, a perfectly square step function is only a theoretical limit.

Diffraction effects will cause images to occur at the edge. These images, in turn, will cause artifacts upon exposure. Trim masks are generally used to remove the artifacts created by the phase shifting mask. A trim mask is a second mask that transmits light, in part, in regions left unexposed by the residual phase edge.

The limits of phase shifted mask lithography are tested by the manufacture of high performance integrated circuits, such as dynamic random access memory (DRAM) technologies. Phase edge PSM lithography makes use of contrast enhancement caused by a phase transition under an opaque feature on a mask.

Phase shift mask solutions are used in lithography to enable printing of very small feature sizes in semiconductors that cannot be realized with conventional techniques. They represent a key technology enabling further shrinking of feature sizes. However, alternating phase shift masks have implications regarding layout rules, such as those relating to line end shortening, which can result in a significant layout area impact and further increase layout rule complexity. Due to the required phase shift technologic rules, some of the prior art design rules must change to accommodate the additional layers introduced in the design by alternate phase shifting methods.

Bearing in mind the problems and deficiencies of the prior art, it is therefore an object of the present invention to provide a methodology to incorporate phase mask shapes having a minimum impact on the current design rules.

It is another object of the present invention to provide phase mask shapes that can eliminate line-end shortening without influencing conventional design styles.

A further object of the invention is to provide a methodology to reduce the space for critical shapes beyond a reference or feature layer.

Still other objects and advantages of the invention will in part be obvious and will in part be apparent from the specification.

SUMMARY OF INVENTION

The above and other objects and advantages, which will be apparent to one of skill in the art, are achieved in the present invention, which is directed to in a first aspect, an apparatus for masking an integrated circuit having an upper edge, a critical portion length, a critical width dimension, and a non-critical portion on a semiconductor wafer having a plurality of devices and layers, the apparatus comprising a phase shift mask made from material through which incident electromagnetic radiation will propagate, the phase shift mask having a phase extension feature including a widened portion adjacent the non-critical portion, the phase extension length extending beyond the critical portion length, and having a reference point relative to a device region. The widened portion comprises a portion of the phase extension adjacent the non-critical portion of the circuit, and may comprise L-shaped or T-shaped portions adjacent the non-critical portion. The phase extension length extends beyond the critical length a shorter distance when the phase extension feature includes the widened portion than when the phase extension feature does not include the widened portion. The widened portion may also terminate at a length shorter than or equal to an extended adjacent length of the non-critical portion of the circuit. The phase extension feature is shortened to a height below the circuit upper edge as measured from the device region, while the mask maintains full lithographic requirements.

In a second aspect, the present invention is directed to an apparatus for masking an integrated circuit having an upper edge, a critical portion length, a critical width dimension, and a non-critical portion on a semiconductor wafer having a plurality of devices and layers, the apparatus comprising at least two phase shift mask features made from material through which incident electromagnetic radiation will propagate, the phase shift mask features having phase extensions with at least one of the phase shift features in the form of a widened portion adjacent the non-critical portion, another of the phase extension features having a length extending beyond the critical portion length as measured from a reference point relative to a device region. At least one of the features is shortened to a height below the integrated circuit upper edge as measured from the reference point. The widened portion comprises a portion of the phase extension adjacent the non-critical portion of the integrated circuit.

In a third aspect, the present invention is directed to a method of high-resolution phase edge lithography for an integrated circuit comprising the steps of: providing a phase edge phase shift mask on a substrate, the mask made from material through which incident electromagnetic radiation will propagate, the mask including a phase extension feature in the form of a widened portion adjacent a non-critical portion of the circuit, and having a reference point relative to a device region; providing a blocking layer partially covering the mask through which electromagnetic radiation cannot be transmitted; and exposing the mask to electromagnetic radiation in a predetermined frequency range for a period of time sufficient to permit the radiation to propagate through the substrate. The widened portion is included as a portion of the phase extension extending adjacent the non-critical portion of the circuit. The widened portion may terminate at a length shorter than the adjacent non-critical portion of the circuit. A circuit portion is L-shaped with an outer edge corner and the widened portion may terminate at the outer edge corner. The widened portion may also extend beyond the non-critical portion of the circuit. A phase extension length may further extend beyond a critical length of the circuit. The phase extension length may extend a shorter distance when the phase extension feature includes the widened portion than when the phase extension feature does not include the widened portion.

In a fourth aspect, the present invention is directed to a method of forming a lithographic mask, comprising: depositing a phase shift mask layer having a phase extension feature about a device segment on a substrate; patterning the mask layer to form a widened phase extension feature extending adjacent a non-critical portion of the device segment; patterning a length of the phase extension feature at a shorter distance when the phase extension feature includes the widened portion than when the phase extension feature does not include the widened portion; and recess etching the periphery pattern to create a region having a predetermined phase shift between the feature and the substrate.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

In describing the preferred embodiment of the present invention, reference will be made herein to FIGS. 1–4 of the drawings in which like numerals refer to like features of the invention. Features of the invention are not necessarily shown to scale in the drawings. As will be recognized by those skilled in the art, the various embodiments described in the present application can be modified and varied over a tremendous range of applications and, accordingly, the scope of the patented subject matter is not limited by any of the specific exemplary teachings given. For example, the masks described herein are used for lithography with various types of radiation, including, but not limited to, ultraviolet radiation, excimer radiation, x-rays, electron beams, and the like. The choice of substrate material depends, in part, on the type of radiation intended to be used with the mask. Additionally, although the gate conductor layer is described herein for exemplary purposes, the present invention is not limited to the gate conductor layer, and may be applied to other layers of the substrate.

For alternate phase shift masks, it is essential that a device print with the designed parameters. This is normally not possible in a simple (prior art) phase shift layout where the reduction of phase line-end shortening requires extensions of the shape in relation to the phase rule. These extensions limit the integrated circuit population on the wafer. The proposed solution is to design the phase shape in a way that addresses the line-end shortening without substantial changes to the design rules or layout size increases due to phase shift rules. If the phase shape receives an angled extension, which includes the lithographic shortening value, the critical shape can be designed much closer to the reference layer then it could without the angled extension.

Figure 1A:
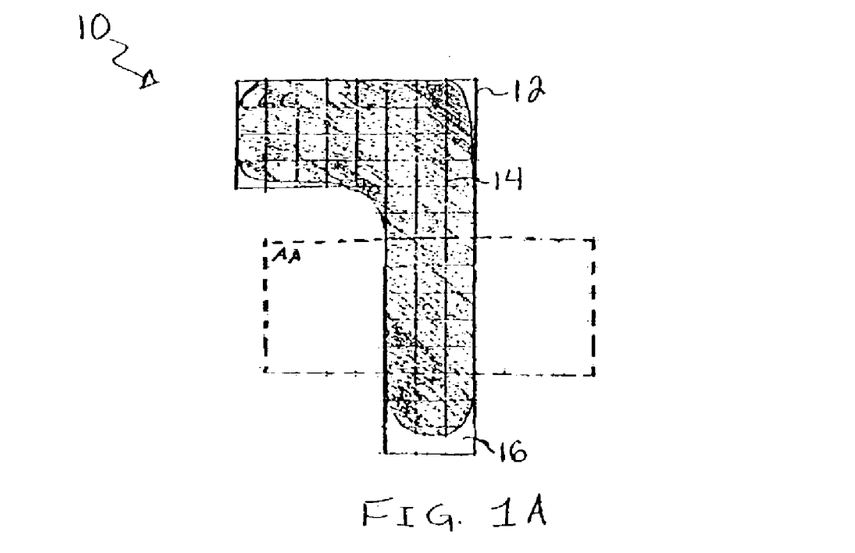
FIG. 1A depicts a gate conductor printed by wide phase shifting features.
Figure 1B:
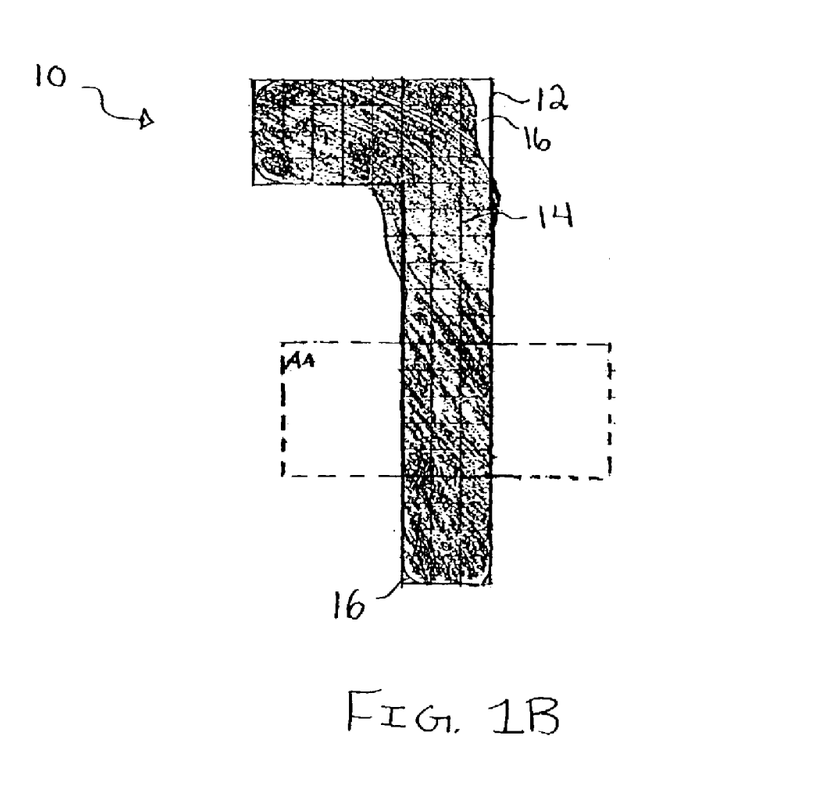
FIG. 1B depicts a gate conductor printed by narrow phase shifting features.
Figure 2A:
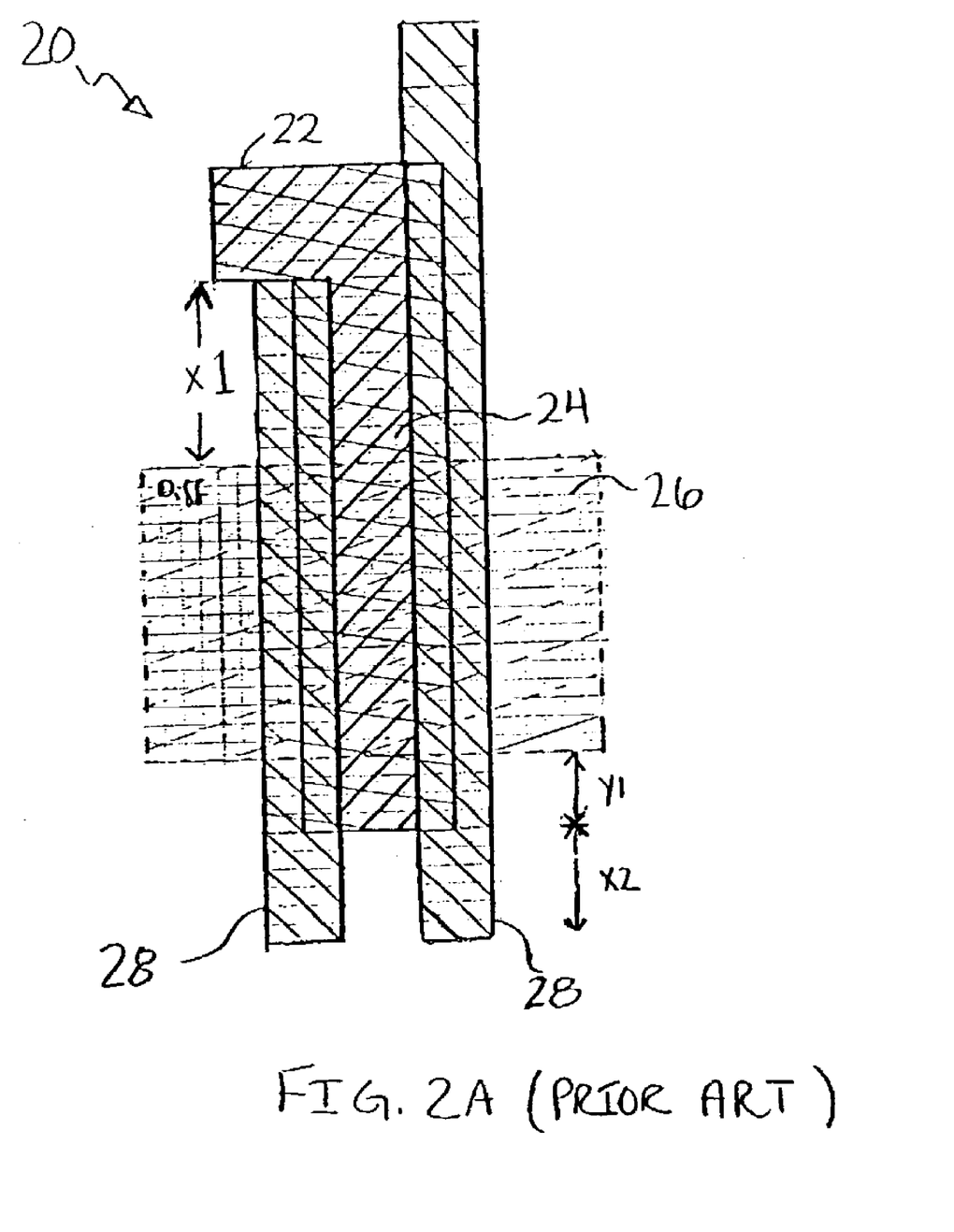
FIG. 2A is a drawing of a gate conductor exhibiting the prior art solution of moving the landing pad up from the device area to guarantee that the narrow portion of the gate conductor will print in the device area.

There are different focal points for phase shortening and line-end dependent interferences. One is the physical shortening of a line, which can result in incorrect feature sizes and unwanted physical shorts between features. FIG. 1A depicts a drawn gate conductor 10 printed by alternating wide phase shifting masks. The lined portion 12 indicates the gate conductor as desired. Straight-edged features are evident in lined portion 12; however, these edges are difficult to achieve without modification to the existing rules due to resultant diffraction patterns at the edges. Shaded portion 1 4 depicts the gate conductor as printed by the alternating phase shift mask, including the trim mask. Line-end shortening of the phase shape is evident 16. As indicated, the feature on the wafer can be quite different from the drawn feature due to the shortening of the phase shapes. FIG. 1B depicts drawn gate conductor 10 printed by narrow phase shifting masks. Again, line-end shortening is present. This can cause unwanted and unpredictable device behavior. The prior art solution has commonly been to extend the phase shapes by a predetermined amount, or generate phase shapes that are sufficiently wide, such that line-end shortening does not have the above-stated adverse effects. However, both of these methodologies have drawbacks. Both require more space on the wafer, higher feature-to-feature space, or wider device-to-device space because of the wide phases and/or long extensions. FIG. 2A depicts a gate conductor 20 exhibiting the prior art solution of moving the landing pad 22 up away from device area 26 to guarantee that the narrow portion 24 of the gate conductor will print as desired in the device area 26. This extending portion is depicted by length x1. Similarly, the phase shape 28 is extended from the gate conductor 20, by length x2, to print the gate conductor and simultaneously avoid line-end shortening. The conceptual line extension of the polysilicon is depicted by feature y1. By extending the phase beyond the device area, the diffraction pattern effects of the phase shift mask are mitigated.

Figure 2B:
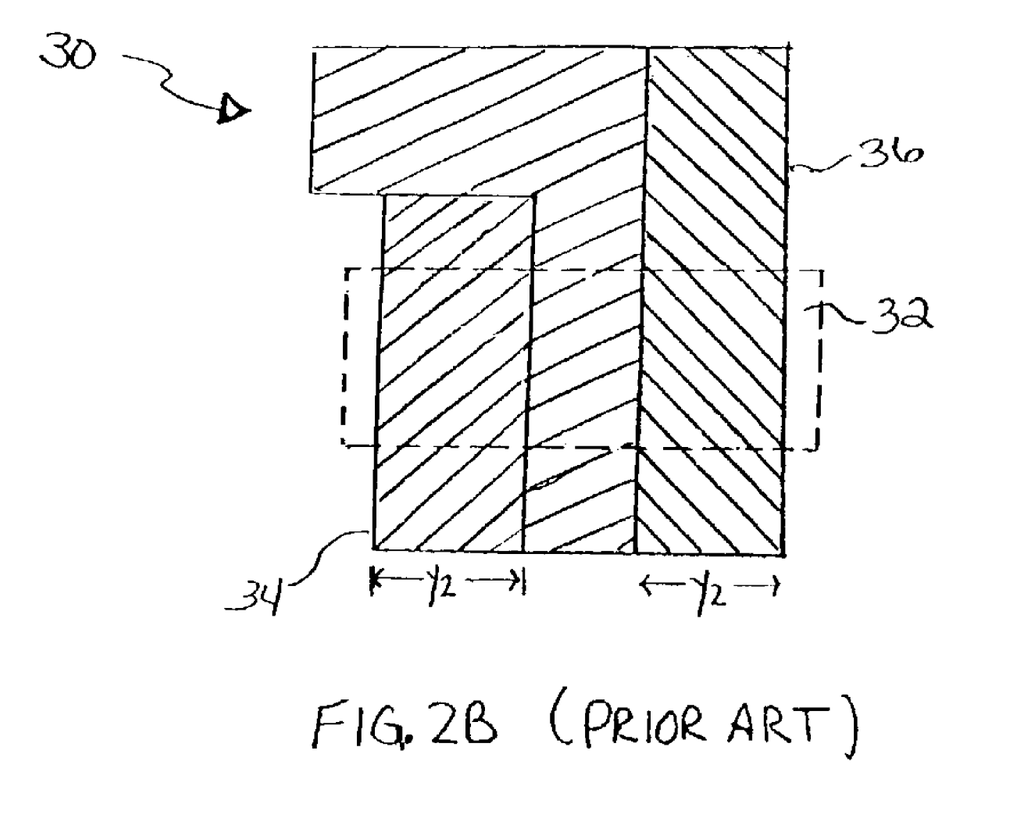
FIG. 2B depicts prior art phase shift mask shapes that are sufficiently wide enough to suppress line-end shortening.

FIG. 2B depicts prior art phase shapes that are sufficiently wide enough to suppress line-end shortening. Gate conductor 30 and device region 32 are shown with widened phase lines 34, 36 having increased widths y2.

FIG. 2A requires a higher device connection-to-reference layer space and a higher feature-to-feature space. FIG. 2B requires a wider device-to-device spacing because of the wide phases 34, 36.

The present invention allows for a close connection-to-reference layer space by following or extending the phase of the connection portion of the mask shape. This allows the device or the lithographically important part of the feature to achieve the desired optical appearance. To reduce the space from a phase-shifted feature to the next feature (or phase) a phase extension is implemented by externally measuring the phase shape starting from the optical or lithographically important part of the feature and extending the phase mask in an angled direction along a non-critical portion.

Figure 3A:
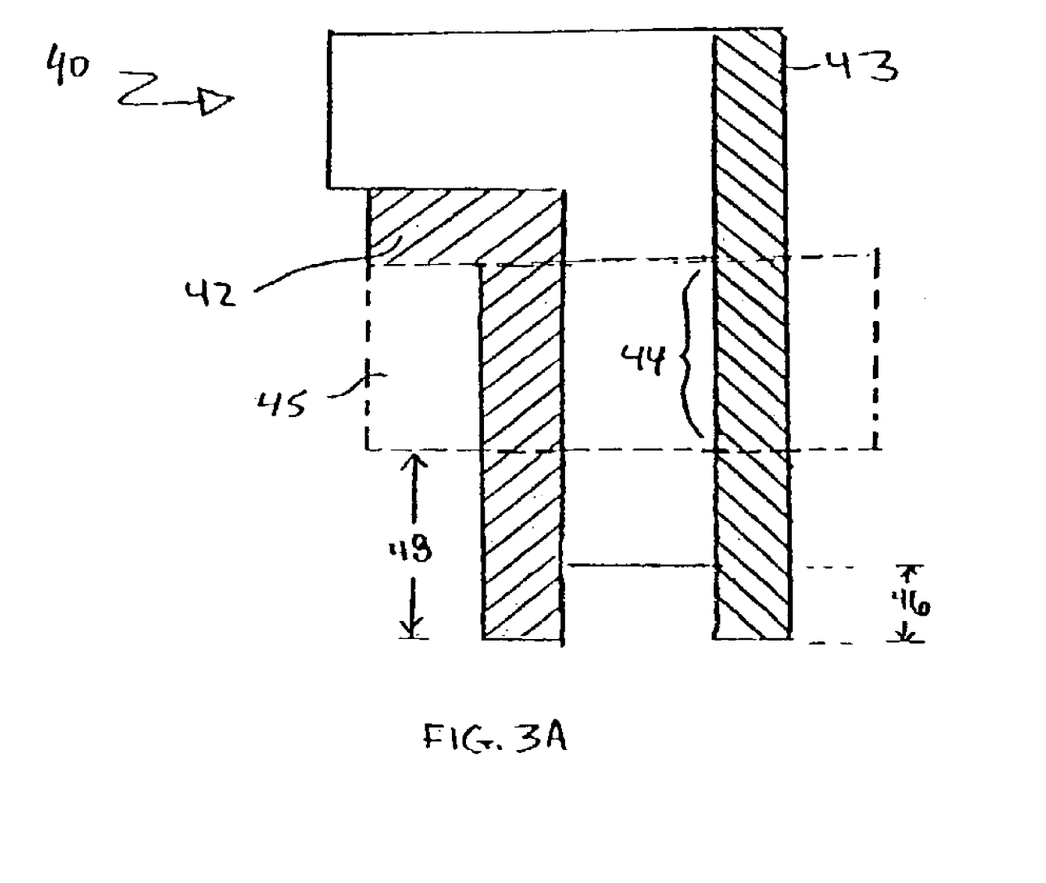
FIG. 3A depicts a gate conductor exhibiting the preferred phase shift features of the present invention.
Figure 3B:
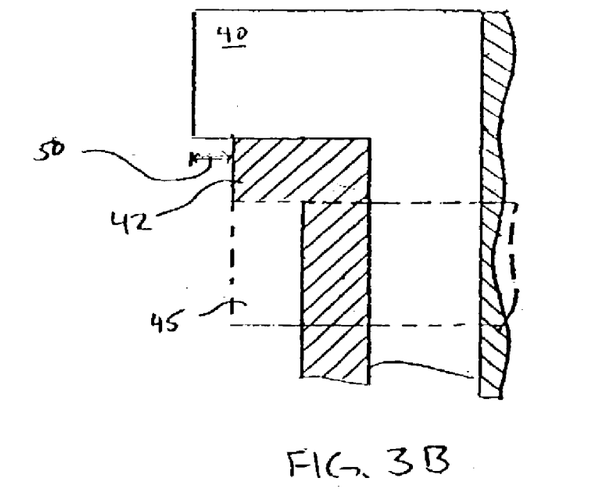
FIG. 3B depicts the termination of the L-shaped feature of FIG. 3A to be shorter than the gate conductor extended length.
Figure 3C:
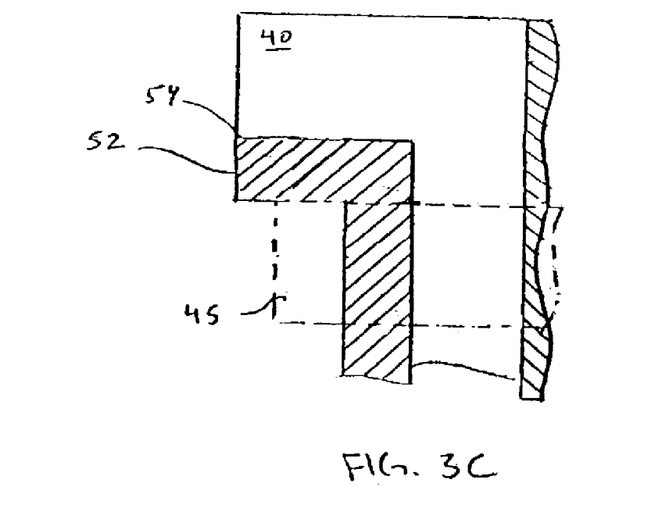
FIG. 3C depicts having L-shaped feature of FIG. 3A extend to the corner of the gate conductor portion.
Figure 3D:
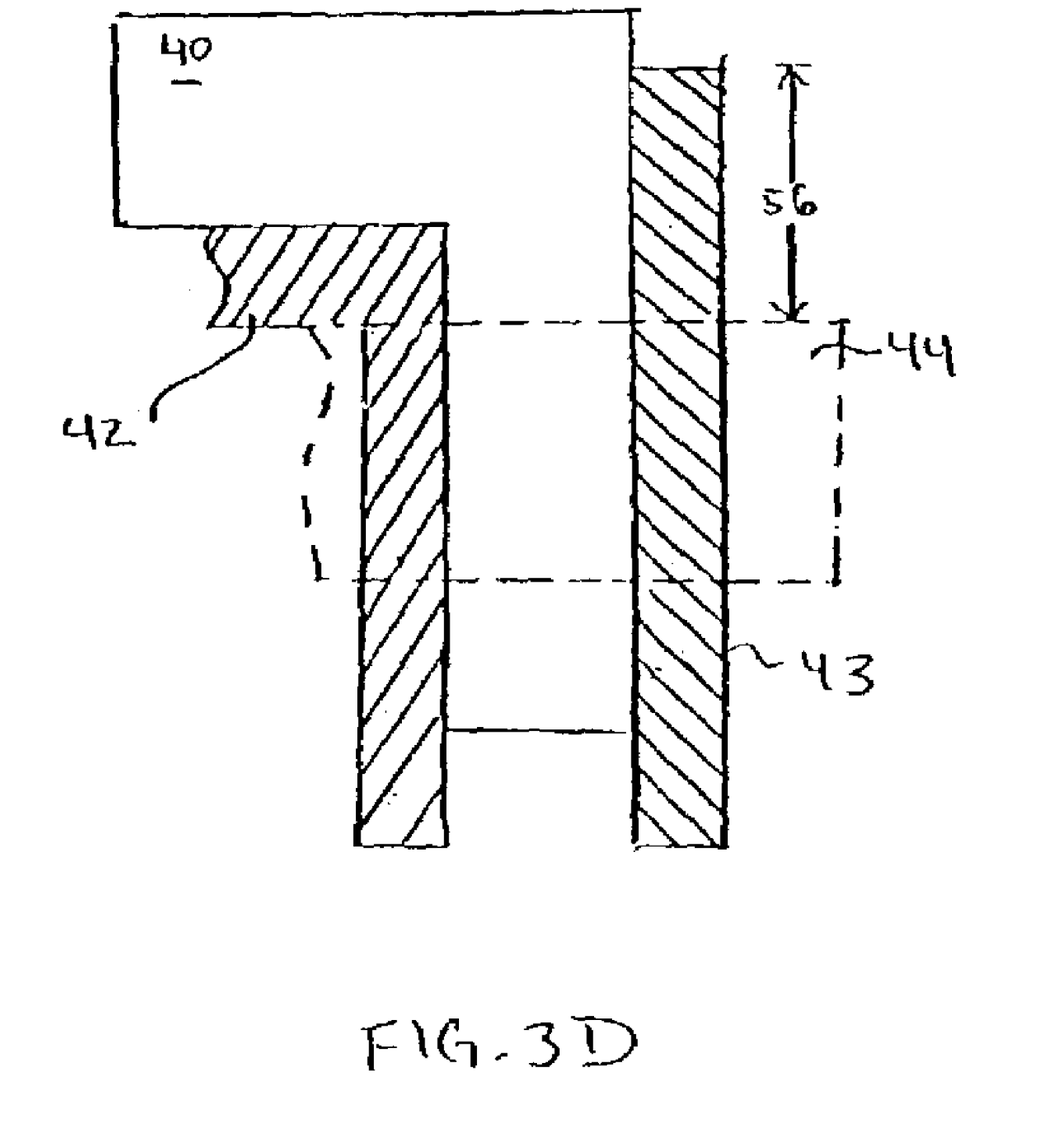
FIG. 3D depicts a phase mask feature not extending to the top of the gate conductor of FIG. 3A, as measured from the device area.

FIG. 3A depicts a gate conductor exhibiting the preferred embodiment of the present invention. Importantly, a gate conductor 40 is designed with external phase shapes 42, 43 made to follow the non-critical portion of the gate conductor shape. This reduces the phase mask extensions features to lengths that are more manageable with increasingly populated substrates. In this example it is desired that a defined portion of the gate conductor having length 44 must print accurately. In order to incorporate the line-end shortening condition the phase feature is made to bend around existing device portions. As shown, phase shape 42 is L-shaped to follow the non-critical portion of the gate conductor. Under this condition, the requirement to print the gate conductor longitudinal length may also be relaxed, and thus, unlike the prior art, the phase mask portion extending beyond the gate conductor bottom, length 46, can be significantly shortened without jeopardizing line-end shortening. The design rule measurement reference point is changed from the gate conductor to the device region portion 45 as indicated by length 48. If the phase shape receives an angled extension (such as an L-shape), which includes the lithographic shortening value, the critical shape can be designed much closer to the reference layer than it otherwise could be without the angled extension. FIGS. 3B–3D depict alternate phase and trim shapes of the present invention. Specifically, FIG. 3B allows for the termination of the L-shaped feature 42 to be shorter than the gate conductor by length 50. Conversely, FIG. 3C depicts the L-shaped feature 52 to extend to the corner 50 of the gate conductor 40. On the opposite side of the gate conductor, trim feature 43, originally shown in FIG. 3A to extend to the top of the gate conductor, may be shortened to a length 56 as measured from the device area 44, as shown in FIG. 3D. Effectively, within the design rules of the present invention, the phase and trim features can be shortened while still maintaining the full lithographic requirements.

Figure 4A:
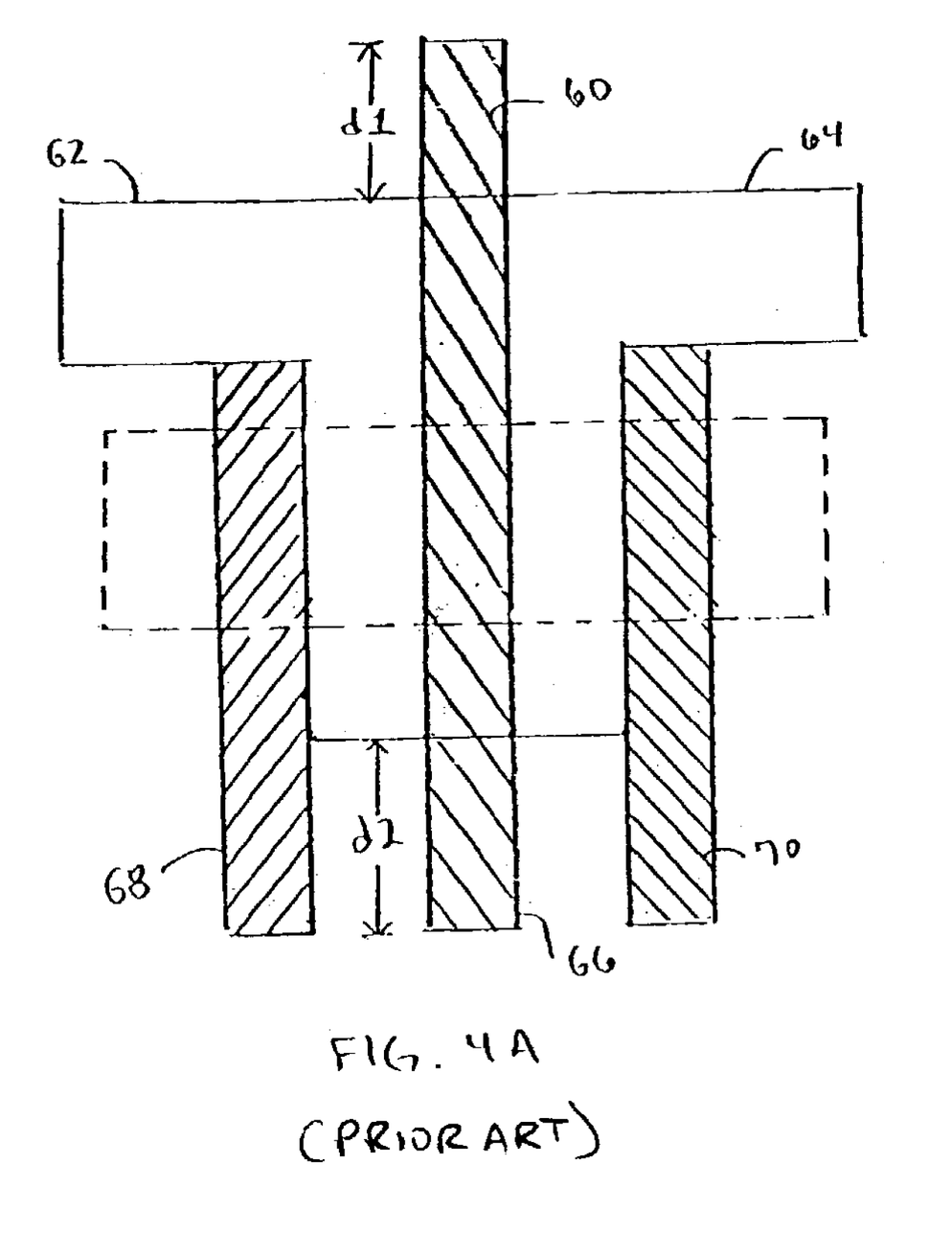
FIG. 4A depicts gate conductors sharing a phase shift feature.
Figure 4B:
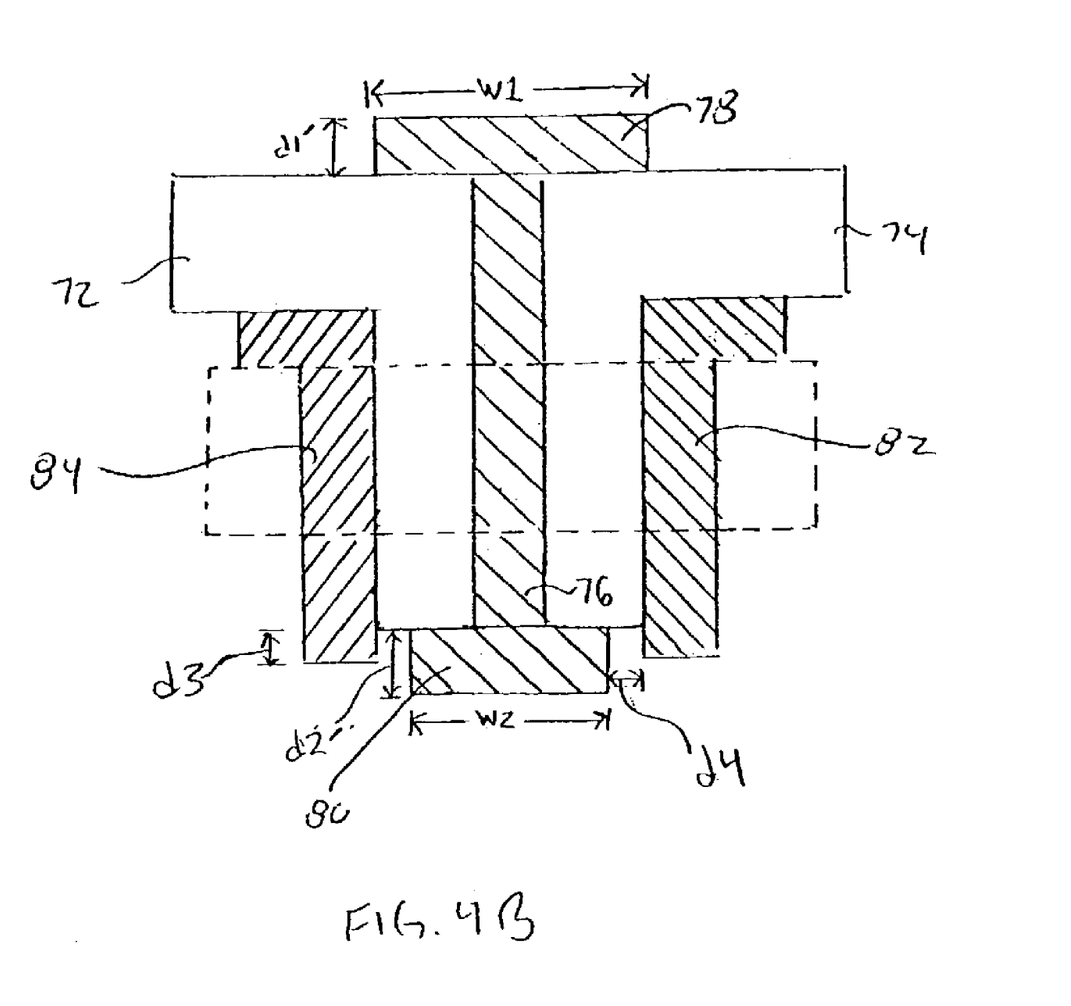
FIG. 4B depicts a shared phase shift feature of gate conductors of FIG. 4A under the design rules of the present invention.

For close critical shapes where a phase may be shared, as depicted in FIG. 4A, the top portion of the center, shared phase feature 60 must be extended a known, predetermined distance d1 beyond the gate conductors 62, 64. Similarly, the bottom portion 66 of the center, shared phase feature 60 must also extend a known, predetermined distance d2 beyond the gate conductor bottom ends in order to reduce line-end shortening. These extensions are typically appreciable, and impact the design of highly populated substrates. Side trim mask features 68, 70 are also extended to mitigate line-end shortening effects. In contrast, applying the design rules of the present invention, FIG. 4B depicts gate conductors 72, 74 with phase features much shorter in length than the prior art. Specifically, the center, shared phase feature 76 is truncated with T-shaped portions 78, 80 on the top and bottom, respectively, extending distances d1' for T-shaped feature 78 and d2' for T-shaped feature 80. These distances are much shorter than their respective prior art counterparts' distances. By using the T-extension on the outside of the gate conductors, the phase extensions are significantly reduced, which allows other phase feature shapes in closer proximity. Reducing the phase extensions allows phase shift masks to be utilized in existing designs without significant redesign. The T-shaped extensions are shown with widths w1 and w2 for the top and bottom portions, respectively. Through this more compact design, relative chip size growth is unaffected by the introduction of the new design rules. Moreover, the present design rules can accommodate increased chip complexity.

Side phase mask features 82, 84 are shown with L-shaped extensions for their top portions. These extensions reduce the line-end shortening at the proximate gate conductor locations. Importantly, phase mask features 82, 84 extend past the bottom portion of the gate conductor a distance d3, which is much less than the nominal distance d2 of the existing prior art design rules, and may be less than distance d2' of the present design. Having the angled phase mask features extend a distance d3 beyond the gate conductor bottom portion allows for a smaller width of the center phase feature's bottom T-shaped extension w2 as compared to the center feature's top portion T-shaped extension width w1. The required space d4 between the masks is dependent upon the technology, and in certain cases may be allowed to be zero, i.e., having the features touch.

Thus, under the design rules of the present invention, phase mask extensions beyond a given feature can be significantly reduced by a) lengthening the phase feature along an uncritical feature portion; b) moving the phase feature reference point to the device layer; and c) flattening the phase extension (L-shaping or T-shaping) along the uncritical parts of the device. Applying these design rules allows one to draw the gate conductor under current conditions and put phase shapes inside without extending the gate conductor dimensions. For these extensions, a much smaller length is sufficient to be as lithographically as effective as the prior art phase masks.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus for masking an integrated circuit having an upper edge, a critical portion length, a critical width dimension, and a non-critical portion on a semiconductor wafer having a plurality of devices and layers, said apparatus comprising a phase shift mask made from material through which incident electromagnetic radiation will propagate, said phase shift mask having an angled phase extension feature including a widened portion adjacent said non-critical portion, said phase extension length extending beyond said critical portion length, and having a reference point relative to a device region, such that said angled phase extension traverses said critical portion length and extends in an angled direction along said non-critical portion.

2. The apparatus of claim 1 wherein said widened portion comprises a portion of said phase extension adjacent said non-critical portion of said circuit.

3. The apparatus of claim 2 wherein said widened portion extends beyond said non-critical portion of said circuit.

4. The apparatus of claim 2 wherein said widened portion terminates at a length shorter than an extended adjacent length of said non-critical portion of said circuit.

5. The apparatus of claim 2 wherein said widened portion terminates at a length equal to an extended adjacent length of said non-critical portion of said circuit.

6. The apparatus of claim 1 wherein said widened portion comprises L-shaped or T-shaped portions adjacent said non-critical portion.

7. The apparatus of claim 1 further comprising having said phase extension length extend beyond said critical length a shorter distance when said phase extension feature includes said widened portion than when said phase extension feature does not include said widened portion.

8. The apparatus of claim 1 wherein said phase shift mask further includes a trim mask.

9. The apparatus of claim 1 wherein said phase extension feature is shortened to a height below said circuit upper edge as measured from said device region, while said mask maintains full lithographic requirements.

10. An apparatus for masking an integrated circuit having an upper edge, a critical portion length, a critical width dimension, and a non-critical portion on a semiconductor wafer having a plurality of devices and layers, said apparatus comprising at least two phase shift mask features made from material through which incident electromagnetic radiation will propagate, said phase shift mask features having angled phase extensions with at least one of said phase shift features in the form of a widened portion adjacent said non-critical portion, another of said phase extension features having a length extending beyond said critical portion length as measured from a reference point relative to a device region, such that said angled phase extension traverses said critical portion length and extends in an angled direction along said non-critical portion.

11. The apparatus of claim 10 wherein at least one of said features is shortened to a height below said integrated circuit upper edge as measured from said reference point.

12. The apparatus of claim 11 wherein said widened portion extends adjacent to and beyond said non-critical portion of said integrated circuit.

13. The apparatus of claim 10 wherein said widened portion comprises a portion of said phase extension adjacent said non-critical portion of said integrated circuit.

14. The apparatus of claim 10 wherein said widened portion comprises L-shaped or T-shaped portions adjacent said non-critical portion of said integrated circuit.

15. A method of forming a lithographic mask, comprising:
depositing a phase shift mask layer having a phase extension feature about a device segment on a substrate;
patterning said mask layer to form a widened angled phase extension feature extending adjacent a non-critical portion of said device segment, said angled phase extension feature extending beyond a critical portion length, and having a reference point relative to said device segment, such that said angled phase extension traverses said critical portion length and extends in an angled direction along said non-critical portion;
patterning a length of said phase extension feature at a shorter distance when said phase extension feature includes said widened portion than when said phase extension feature does not include said widened portion; and
recess etching said periphery pattern to create a region having a predetermined phase shift between said feature and said substrate.

16. The method of claim 15 further comprising:
exposing said mask layer to electromagnetic radiation; and
removing said mask after said exposure.

17. The method of claim 15 comprising providing a trim mask such that light is transmitted only in regions left unexposed through any residual phase edge.

18. The method of claim 15 further comprising providing said widened portion as an L-shaped or T-shaped portion of said feature.

19. The method of claim 15 herein said widened portion terminates at a length shorter than an extended length of said non-critical portion of said circuit.

* * * * *